United States Patent
Andry et al.

(10) Patent No.: US 8,263,497 B2
(45) Date of Patent: Sep. 11, 2012

(54) HIGH-YIELD METHOD OF EXPOSING AND CONTACTING THROUGH-SILICON VIAS

(75) Inventors: Paul S. Andry, Yorktown Heights, NY (US); John M. Cotte, New Fairfield, CT (US); Michael F. Lofaro, Stamford, CT (US); Edmund J. Sprogis, Underhill, VT (US); James A. Tornello, Cortlandt Manor, NY (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 12/352,718

(22) Filed: Jan. 13, 2009

(65) Prior Publication Data

US 2010/0178766 A1  Jul. 15, 2010

(51) Int. Cl.
*H01L 21/302* (2006.01)
*H01L 21/461* (2006.01)

(52) U.S. Cl. ........ 438/692; 438/691; 438/695; 438/704; 438/459

(58) Field of Classification Search ......................... None
See application file for complete search history.

(56) References Cited

U.S. PATENT DOCUMENTS

| | | | | | |
|---|---|---|---|---|---|
| 5,390,141 | A | * | 2/1995 | Cohen et al. | 365/96 |
| 5,492,235 | A | * | 2/1996 | Crafts et al. | 438/695 |
| 5,501,893 | A | * | 3/1996 | Laermer et al. | 428/161 |
| 5,622,875 | A | * | 4/1997 | Lawrence | 438/691 |
| 5,646,067 | A | * | 7/1997 | Gaul | 438/458 |
| 6,420,266 | B1 | * | 7/2002 | Smith et al. | 438/692 |
| 6,586,322 | B1 | * | 7/2003 | Chiu et al. | 438/612 |
| 6,713,685 | B1 | * | 3/2004 | Cotton | 174/262 |
| 6,921,719 | B2 | * | 7/2005 | Paterson et al. | 438/704 |
| 7,294,954 | B2 | * | 11/2007 | Syms | 313/103 CM |
| 7,554,130 | B1 | * | 6/2009 | Robins et al. | 257/107 |
| 2006/0042952 | A1 | | 3/2006 | Oliver et al. | |
| 2007/0132105 | A1 | | 6/2007 | Akram et al. | |
| 2007/0257373 | A1 | | 11/2007 | Akram et al. | |
| 2008/0157287 | A1 | | 7/2008 | Choi et al. | |
| 2008/0296763 | A1 | * | 12/2008 | Chen et al. | 257/738 |
| 2010/0032811 | A1 | * | 2/2010 | Ding et al. | 257/621 |

OTHER PUBLICATIONS

U. H. Nguyen I. et al, Dielectric properties analysis of silicone rubber, 2004 Inrernurionul Coifererice on Solid Dielecrrics, Toulouse, Fvunce, Jul. 5-9, 2004.*

(Continued)

*Primary Examiner* — Duy Deo
*Assistant Examiner* — Erin Flanagan
(74) *Attorney, Agent, or Firm* — Ryan, Mason & Lewis, LLP

(57) ABSTRACT

An assembly including a main wafer having a body with a front side and a back side and a plurality of blind electrical vias terminating above the back side, and a handler wafer, is obtained. A step includes exposing the blind electrical vias to various heights on the back side. Another step involves applying a first chemical mechanical polish process to the back side, to open any of the surrounding insulator adjacent the end regions of the cores remaining after the exposing step, and to co-planarize the via conductive cores, the surrounding insulator adjacent the side regions of the cores, and the body of the main wafer. Further steps include etching the back side to produce a uniform standoff height of each of the vias across the back side; depositing a dielectric across the back side; and applying a second chemical mechanical polish process to the back side.

18 Claims, 10 Drawing Sheets

OTHER PUBLICATIONS

Rowbotham, Backside Thinning and Processing for Through-silicon Via (TSV) Technology, University of Arkansas, vol. 45/06 of Masters Abstracts, of Dissertations Abstracts International, p. 3254, Abstract only (2006).

* cited by examiner

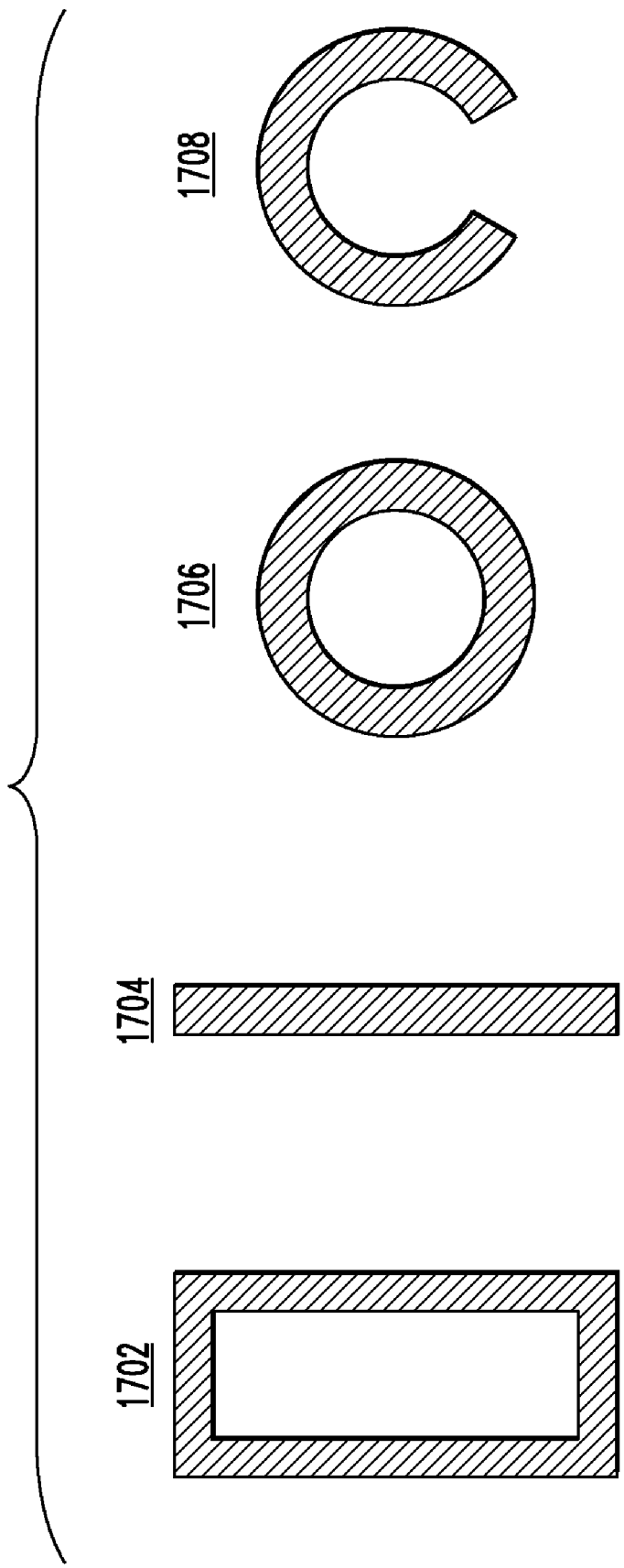

HIGH-YIELD METHOD OF EXPOSING AND CONTACTING THROUGH-SILICON VIAS

FIELD OF THE INVENTION

The present invention generally relates to the electrical and electronic arts and, more particularly, to through-silicon vias (TSVs).

BACKGROUND OF THE INVENTION

A through-silicon via (TSV) is a vertical electrical connection passing completely through a silicon wafer or die. TSV technology is of interest, for example, in creating three-dimensional (3D) packages and 3D integrated circuits.

US Patent Application Publication No. 2007-0257373 of Akram et al. discloses methods of forming blind wafer interconnects, and related structures and assemblies. Methods for forming blind wafer interconnects (BWIs) from the back side surface of a substrate structure to the underside of a bond pad on the opposing surface includes the formation of a blind hole from the back side surface, forming a passivating layer therein, removing passivation material from the blind hole bottom, depositing at least one conductive layer within the blind hole, and filling the blind hole with solder or other conductive material or a dielectric material.

US Patent Application Publication No. 2007-0132105 of Akram et al. discloses selective activation of aluminum, copper, and tungsten structures. A method of activating a metal structure on an intermediate semiconductor device structure toward metal plating comprises providing an intermediate semiconductor device structure comprising at least one first metal structure and at least one second metal structure on a semiconductor substrate. The at least one first metal structure comprises at least one aluminum structure, at least one copper structure, or at least one structure comprising a mixture of aluminum and copper and the at least one second metal structure comprises at least one tungsten structure. One of the at least one first metal structure and the at least one second metal structure is activated toward metal plating without activating the other of the at least one first metal structure and the at least one second metal structure. An intermediate semiconductor device structure is also disclosed.

US Patent Application Publication No. 2006-0042952 of Oliver et al. discloses methods for forming interconnects in vias and microelectronic work pieces including such interconnects. The blind vias can be formed by first removing the bulk of the material from portions of the back side of the work piece without thinning the entire work piece. The bulk removal process, for example, can form a first opening that extends to an intermediate depth within the work piece, but does not extend to the contact surface of the electrically conductive element. After forming the first opening, a second opening is formed from the intermediate depth in the first opening to the contact surface of the conductive element. The second opening has a second width less than the first width of the first opening. This method further includes filling the blind vias with a conductive material and subsequently thinning the work piece from the exterior side until the cavity is eliminated.

Backside thinning and processing for through-silicon via (TSV) technology, a master's dissertation of Theron Rowbotham, M.S.E.E., University of Arkansas, 2006, available in volume 45/06 of Masters Abstracts, of Dissertations Abstracts International, at page 3254, discusses research performed to create through-silicon vias (TSVs) for chip stacking applications. This thesis discusses three of the processing steps involved in producing through-silicon vias; wafer bonding, wafer thinning, and exposing blind vias from the back side.

SUMMARY OF THE INVENTION

Principles of the present invention provide high-yield techniques for exposing and contacting through-silicon vias. An exemplary method includes the step of obtaining an assembly including a main wafer having a body with a front side and a back side, and a handler wafer. The main wafer has a plurality of blind electrical vias terminating above the back side (i.e., within the body of the silicon wafer). The blind electrical vias have conductive cores with surrounding insulator adjacent side and end regions of the cores. The handler wafer is secured to the front side of the body of main wafer. An additional step includes exposing the blind electrical vias on the back side. The blind electrical vias are exposed to various heights across the back side. Another step involves applying a first chemical mechanical polish process to the back side, to open any of the surrounding insulator adjacent the end regions of the cores remaining after the exposing step, and to co-planarize the via conductive cores, the surrounding insulator adjacent the side regions of the cores, and the body of the main wafer. Further steps include etching the back side to produce a uniform standoff height of each of the vias across the back side; depositing a dielectric across the back side; and applying a second chemical mechanical polish process to the back side, to open the dielectric only adjacent the conductive cores of the vias.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 10 depicts exemplary transverse cross sections of TSVs, according additional aspects of the invention.

DETAILED DESCRIPTION OF PREFERRED EMBODIMENTS

Figure 1:
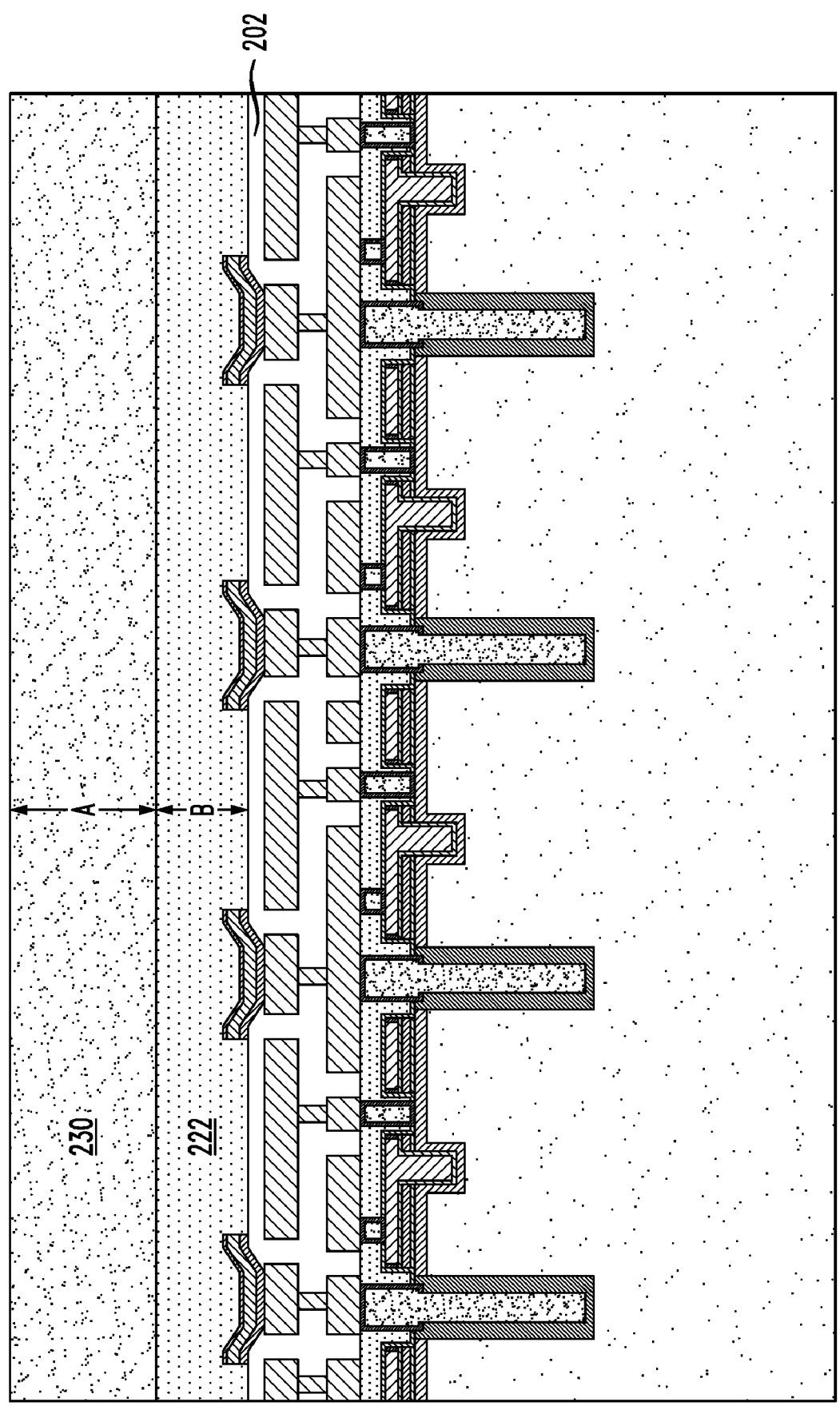
FIG. 1 presents an exemplary starting point for an exemplary process, according to an aspect of the invention, the starting point including a fully processed silicon wafer with blind vias, devices, wiring and top surface pads bonded to a handler wafer.

The starting point for one or more embodiments of the invention is a fully processed silicon wafer including blind vias (typically insulated vias with conductive metal cores which terminate in the body of the silicon wafer at some depth below the top side but above the wafer backside) as well as any combination of features found in standard microelectronics manufacturing, such as FET or bipolar devices, wiring layers and terminal bonding pads. Further, it is understood that this fully processed wafer has been bonded to another handler wafer using any one of a number of standard techniques, which may include but are not limited to metallurgical bonding (e.g. Cu or Au thermocompression), oxide bonding or adhesive bonding. Many such techniques are known and available to those of ordinary skill in the art. In one or more embodiments, a polyimide-based adhesive is used to bond a glass wafer to the fully processed silicon wafer at a temperature on the order of 350 C. The net result of this operation is a void-free interface and a solidly bonded wafer pair as illustrated in FIG. 1, including glass 230 bonded to wafer 202 by adhesive 222. In a non-limiting exemplary embodiment, depth B of adhesive may be about 5 microns, while thickness A of glass 230 may be about 700 microns.

For the sake of consistency with regard to use of "above" and "below" with respect to the drawings, in particular with respect to the original front and back surfaces as shown in the drawings, in one or more embodiments, processing starts with a blind via (below front and above back surface by definition), eventually exposed such that the metal is below (i.e., "sticking out from") or coplanar with the back surface. Use of terms such as "above" and "below" does not necessarily imply that the elements need to be oriented in any particular way with respect to the gravity vector. Furthermore, in some instances, the vias might only be "blind" with respect to the back surface. By way of further clarification, vias are technically blind whenever they cannot be accessed from above and below. On the original silicon wafer they are blind because they can be accessed from the top pads, but not bottom. When the handler 230 is attached, technically they are blind or buried from both sides. When exposed as in the example herein, they are actually still blind due to the handler, but from the point of view of the original wafer they are through vias after exposure. The handler can be detached at the end (i.e., after FIG. 9), after which there is access to the top pads and the bottom pads, and hence at that point the vias are usable "through-vias" not blind vias.

Mechanical Grinding Module

Figure 2:
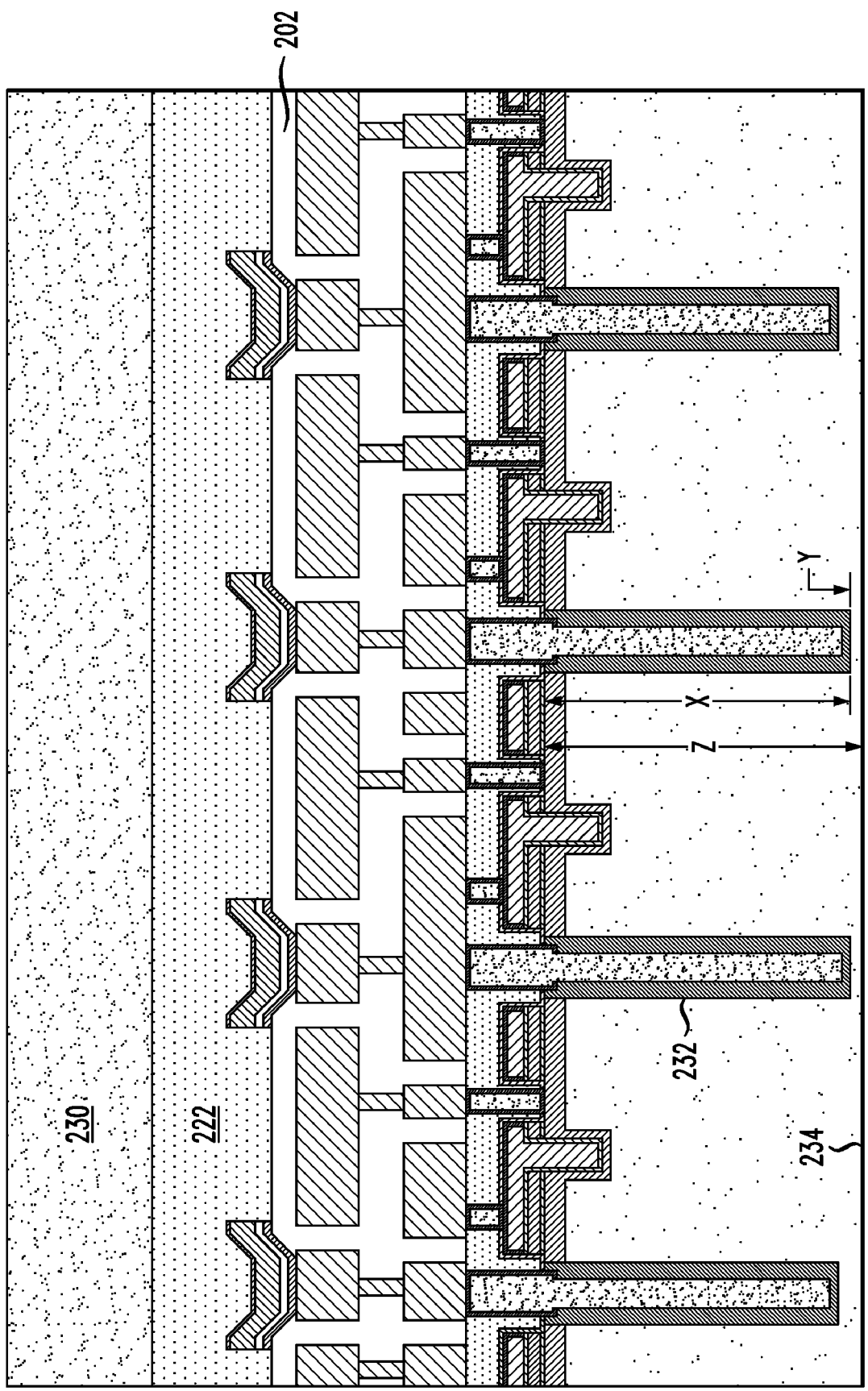
FIGS. 2-9 depict an exemplary sequence of back side processing steps in the above-mentioned exemplary process.

Following handler wafer bonding, the wafer pair (for example, nominally about 1.4 mm thick) is transferred to a commercial wafer grinding tool. Mechanical thinning includes, for example, the following three steps: coarse grinding, fine grinding, and final polish. The final target depth is set so as to leave ~10 μm of silicon (dimension "Y") covering the nominal 100 μm deep TSVs 232 (dimension "X"), for a total depth "Z" of approximately 110 μm, as shown in FIG. 2. The grinding is carried out on the back side 234 of the wafer 202. Coarse grinding is used to remove the bulk of the wafer, but the coarse grind process, although quite fast, leaves a very rough surface with damage penetrating below the surface to at least a depth of ~30 μm. It is thus preferred to stop the coarse grind process at least about 30 μm before reaching the final target, and to then switch to the fine grind wheel. The fine grind should be used to remove about the last 30 μm (or more) of silicon. This effectively removes the sub-surface damage created by the coarse grind.

Once the final target is reached, and only ~10 μm of silicon remains covering the TSV, as shown in FIG. 2, a final silicon polish should be used to create a mirror finish. The final polish is similar to a standard silicon chemical-mechanical polishing (CMP) process, and only needs to remove ~0.5 μm of silicon. If the final polish is not done, wet etching using tetramethylammonium hydroxide (TMAH) or potassium hydroxide (KOH) will quickly reveal "swirl patterns" caused by the fine grind wheel. A final polish will leave the silicon surface pristine and ready for further thinning. It is also preferred to use a proper brush cleaning or wet clean process, which may include wiping with isopropyl alcohol (IPA) followed by a water rinse and spin dry, to remove any trace of polish slurry which might act as an etch mask during the via exposure steps.

TSV Exposure and Backside Insulation Module

Figure 3:
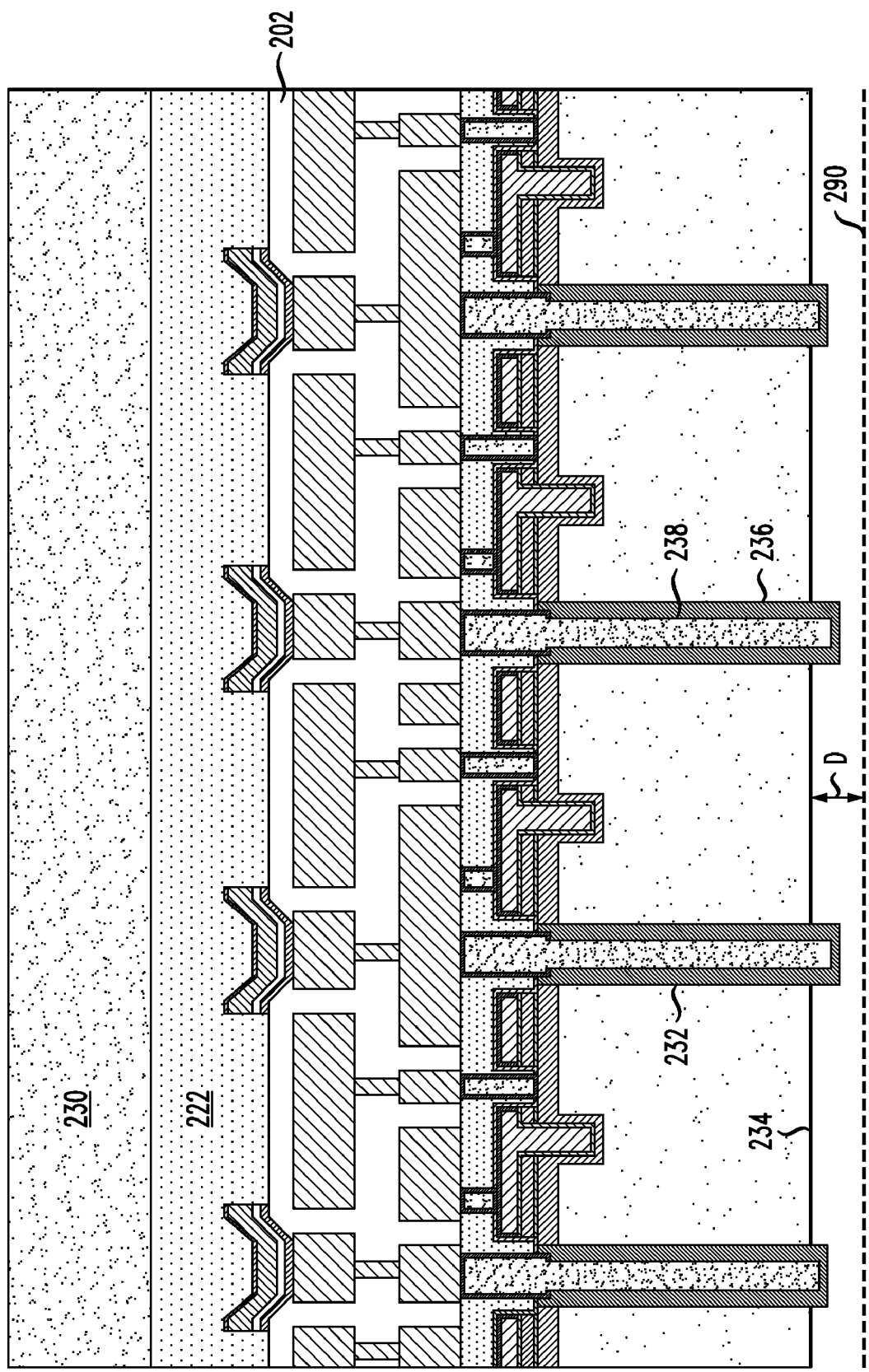

FIGS. 3-6 show the TSV exposure and field insulation steps. In one or more embodiments, this sequence is quite significant, because poor backside processing here can lead directly to TSV leakage through the silicon substrate during FBEOL metallization, presenting problems for input/output (I/O), power, and ground connections alike. Referring to FIG. 3, the preferred method of exposing the TSVs is to use blanket deep reactive ion etching (D-RIE) (~4 μm/minute) or a reasonably fast (~1 μm/minute) Si reactive ion etching (RIE) process. Provided that glass handlers of uniform thickness are used, the TSV pattern should be exposed across the entire wafer backside 234 after 3 to 6 minutes. Longer times tend to lead to higher silicon roughness, as well as "black silicon" residue build-up near the edges of the wafer. The etching causes removal of material to a depth D below the original back surface 290. D may be, for example, about 10 microns.

Figure 4:
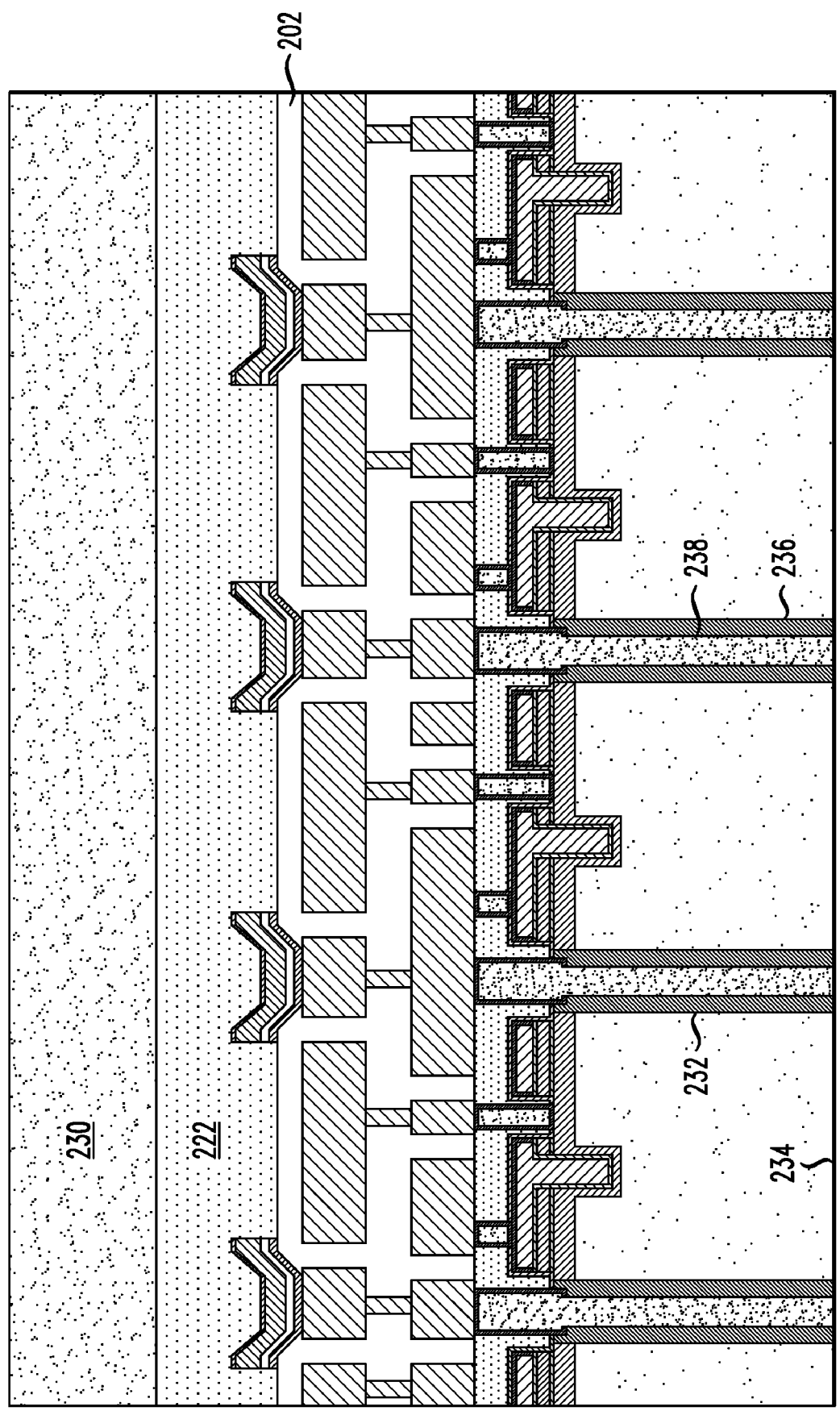
Figure 5:
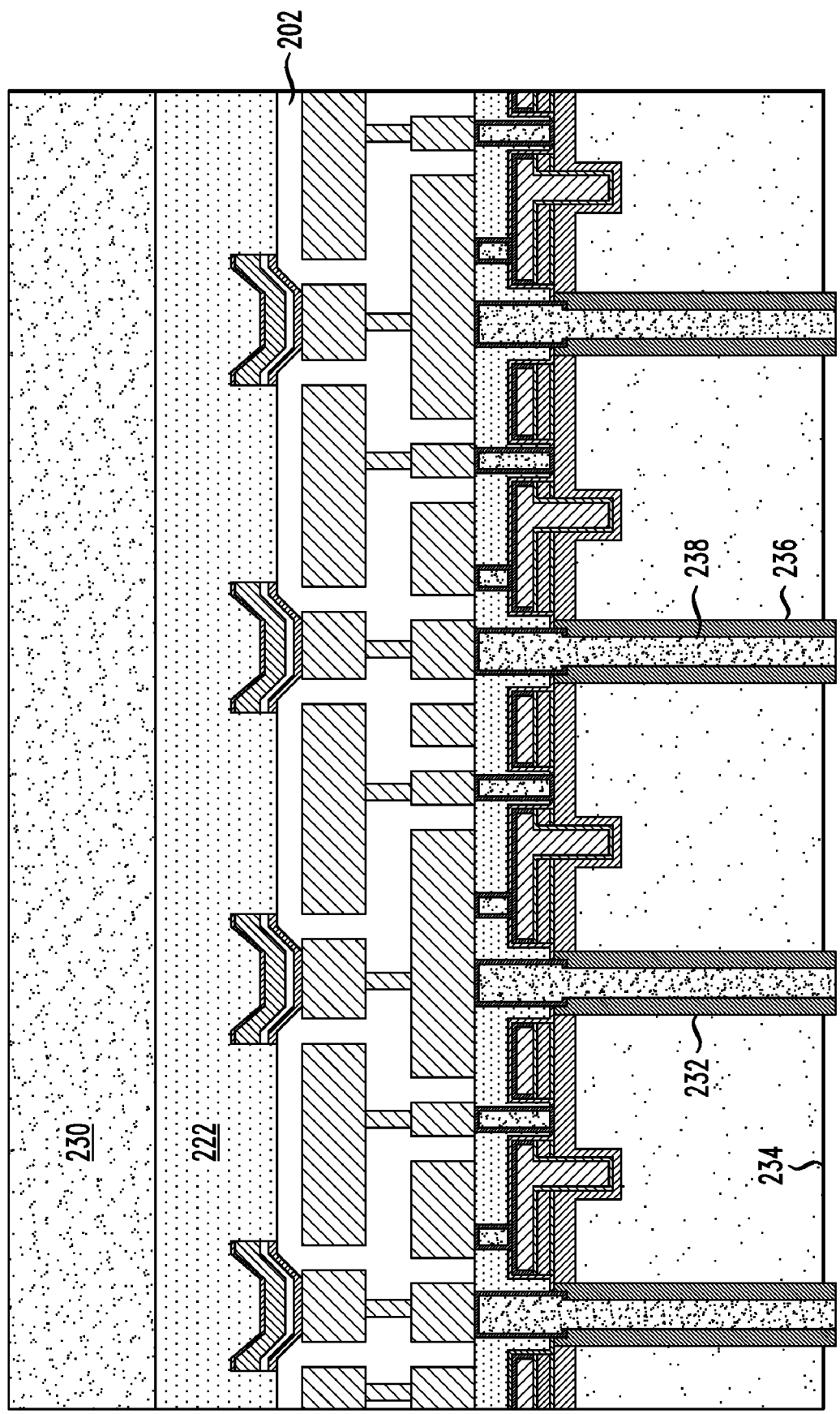

Due to center-to-edge variations in the D-RIE process itself, as well as small variations in glass thickness, the TSVs will typically be exposed by ~3 μm to ~8 μm depending on their location on the wafer. It is advisable to expose every TSV on the wafer by at least ~3 μm, thus ensuring that the following CMP planarization process opens both the oxide shells 236 surrounding the tungsten fill, as well as the metal 238 itself. A number of slurries can be used in this step, however, it has been shown that a slurry designed to polish tungsten is fairly effective at co-polishing tungsten, oxide and the silicon field. Polish times will vary according to the initial height of exposure of the TSVs as well as the degree of roughness of the silicon field. The goal of the first planarization step is to leave tungsten, oxide and silicon as coplanar as possible, as shown in FIG. 4. This effectively "resets" the height of all TSVs 232 to zero, allowing the second D-RIE process to recess the Si field surrounding each TSV by a precise amount everywhere across the wafer, as shown in FIG. 5.

Figure 6:
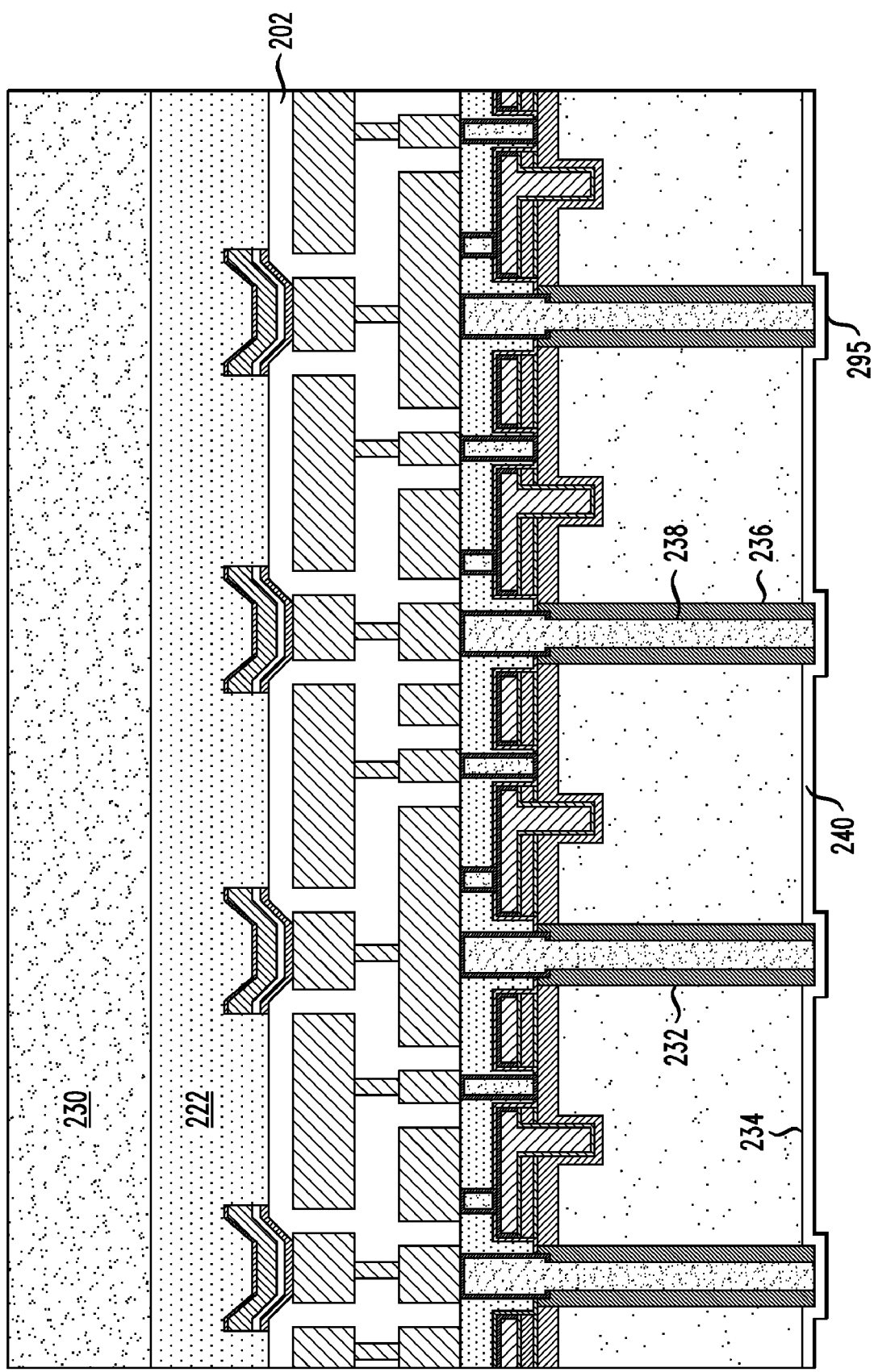

The next step is to deposit backside dielectric using a low-temperature PECVD process (~300° C. or less). The lower temperature process ensures that the adhesive will survive the vacuum process with minimal out-gassing, which can lead to void formation. As illustrated in FIG. 6, a combination of oxide and nitride materials 240 is useful to provide good adhesion, electrical insulation and protection against moisture and mobile ions. The tensile and compressive nature of the PECVD films can also be used to balance the net compressive or tensile properties of the levels on the front side of the wafer, thus controlling warp and bow in the final released carriers. The final step in the backside process sequence is to employ oxide CMP to remove the PECVD dielectric stack over the raised TSVs. This oxide "cap knock-off" CMP, shown in FIG. 7, leaves the entire backside 234 of the wafer 202 insulated, except the tungsten metal cores 238 of the TSVs 232. Following inspection of the final back side process, the carriers are ready for final FBEOL terminal metals processing. In a non-limiting example, distance "C" can be about 90 μm.

FBEOL Module

Figure 8:
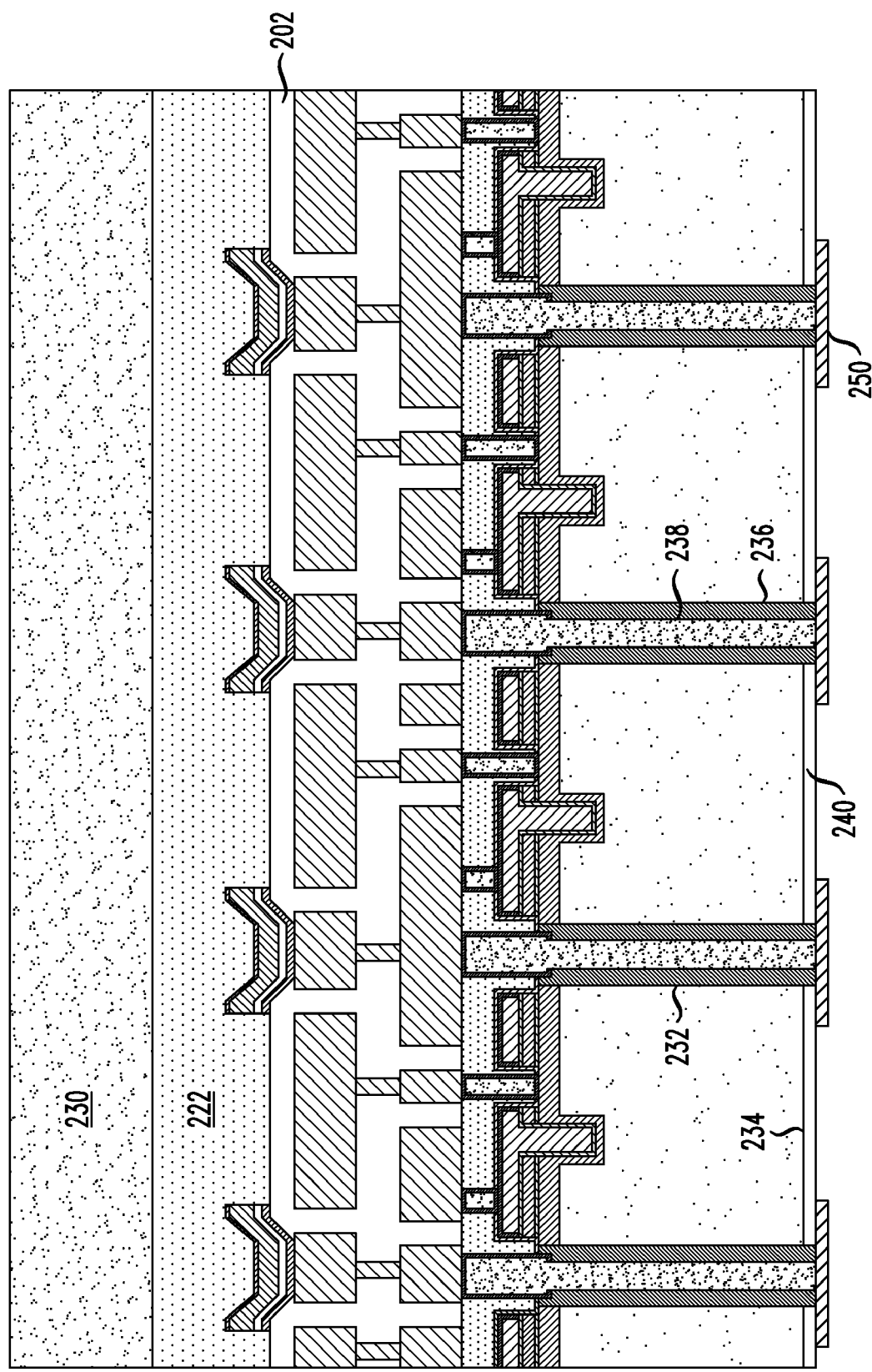
Figure 9:
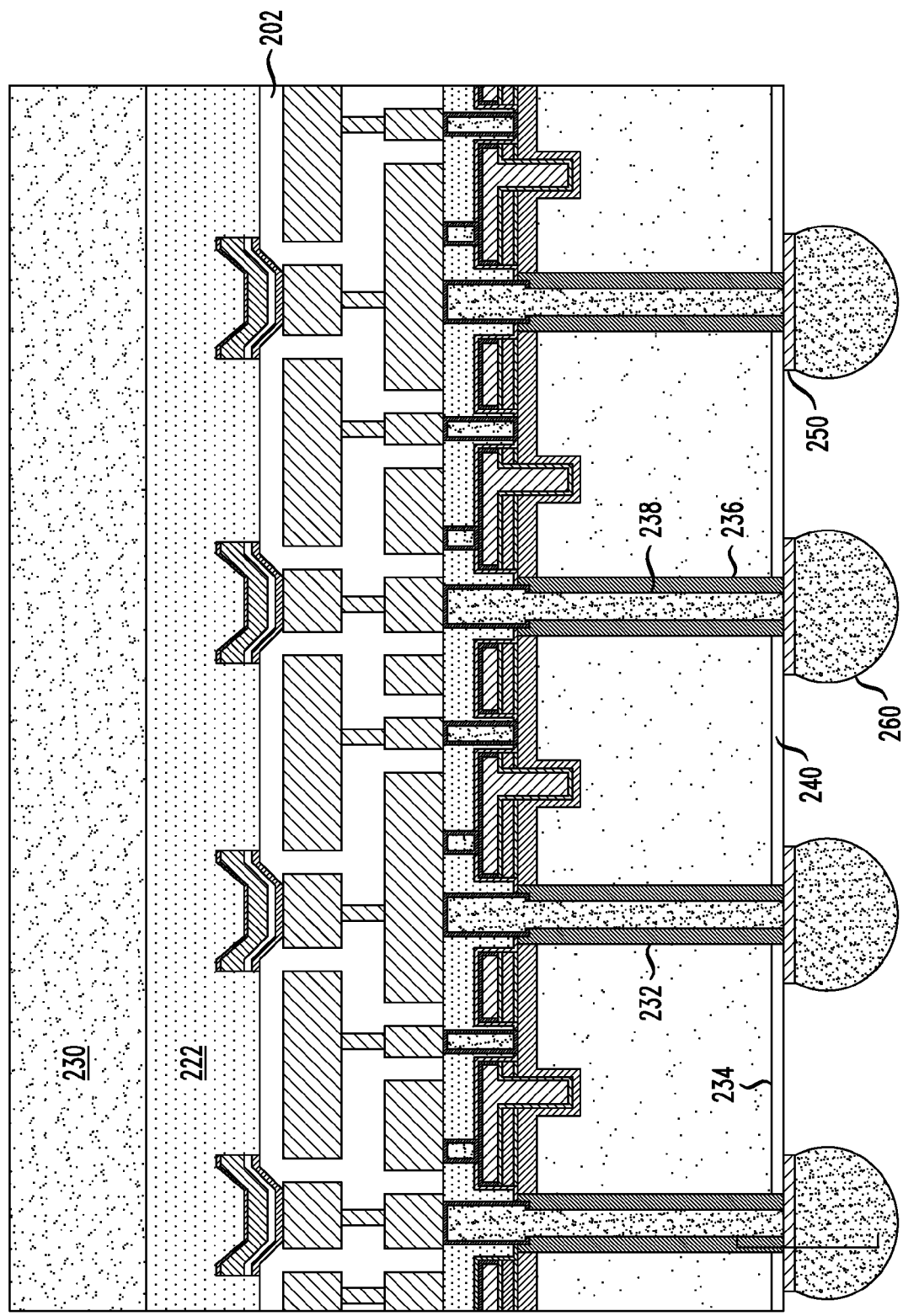

As is typical with standard complementary metal oxide semiconductor (CMOS) wafers, the final terminal metals or "wafer bumping" process includes depositing appropriate under-bump-metallization (UBM) pads, as well as C4 (Controlled Collapse Chip Connection) solder bumps, across the wafer. A typical process for UBM includes metal sputtering followed by lithography, electroplating and wet seed etching, to define the pads. Evaporation of metals through an aligned shadow mask has also been successfully used in the past. The result is a wafer with aligned pads 250 directly in contact with the TSV tungsten cores 238 as shown in FIG. 8. Solder bumps may be directly plated up through a thick resist mask such as DuPont RISTON photoresist (RISTON is a registered mark of E. I. Du Pont De Nemours and Company, 1007 Market St., Wilmington, Del. 19898), or they may be transferred from molds to wet-able UBM pads, as in IBM's C4NP process. Aspects of IBM's C4NP process are disclosed in U.S. Pat. Nos. 5,244,143; 5,775,569; and 7,332,424, the complete disclosures of which are expressly incorporated herein by reference in their entirety for all purposes (although the skilled artisan will already be familiar with same). The net result, illustrated in FIG. 9 is a thin, bumped silicon carrier 202, with solder bumps 260, attached to a glass handler 230, and ready for test, dice, pick and assembly. As with previous backside processes, whatever method is chosen to fabricate the UBM pads and solder bumps, the tooling must be properly selected in order to accommodate the glass-backed wafers. The person having ordinary skill in the art, given the teachings herein, will be readily able to select appropriate tooling.

By way of review, in the standard "vias first" or "vias middle" process flows for TSVs, blind metallized vias are fabricated in a silicon wafer near the beginning or middle of the line processing, and these are uncovered to form TSVs much later in the process, after the BEOL wiring has been completed. Typically, the wafers are attached to a handler wafer, which may be silicon or glass depending on the process flow and/or final structure, and the wafer containing the blind vias is thinned. The sequence of steps by which the wafer is thinned, the vias are exposed, the backside is insulated and electrical pads or solder balls are added is quite important to the final yield of the TSVs. If done incorrectly, the TSVs may become defective and electrical leakage between the signals and power and/or ground TSVs may result. During the deep silicon etching of "vias first" or "vias middle" blind vias, it is common for there to be some variation in via depth from the center to the edge of the wafer, even for vias of the same design dimension. Features of different sizes typically etch to different depths due to RIE lag. Thus blind vias buried under FEOL and BEOL layers will almost certainly be found at different depths during the backside processing.

Furthermore, it is common to use a handler wafer to support the wafer containing the blind vias during the initial thinning of the wafer. Thinning is typically achieved by backside mechanical grinding with coarse and then fine grit wheels. Grind tools can be very uniform in their rate of silicon removal across the wafer, but the handler wafers to which they are attached may not be uniform in thickness, particularly when they are made of glass. Any non-uniformity in the handler, e.g., a wedge-shaped piece of glass, will transfer that variation into the silicon wafer being thinned. The net result of variation in blind via depth and handler uniformity, is that the blind vias will not be exposed at the same time at all locations across the wafer.

Aspects of the invention provide a method using mechanical grinding, and then two sequential plasma etch/CMP processes to accurately expose all the TSVs to a uniform height, and which ensures uniform insulator coverage across the field of the wafer backside, as well as good integrity of the insulator directly surrounding the TSV, which is critical for electrical pad formation.

Furthermore, aspects of the invention address a generalized TSV structure which can be a simple hole, but may also be one of a number of high-aspect ratio shapes including slots, bars, annuli, C-shapes, and the like, which are difficult, if not impossible, to fill by plating techniques. That is to say, the transverse cross section of TSVs 232 may be slot-like 1702, bar-like 1704, annular 1706, C-shaped 1708, and so on, as seen in FIG. 10.

In a preferred embodiment, CVD tungsten fill is employed, with a precise combination of dry etching and CMP, in two distinct cycles, to ensure that all vias 232 are exposed by precisely the same amount at the end of the process, in essence providing a "height resetting" feature.

In view of the non-limiting example presented thus far, it will be appreciated that, in general terms, an exemplary method includes the step of obtaining an assembly including a main wafer 202 having a body with a front side and a back side 234, and a handler wafer 230. The main wafer has a plurality of blind electrical vias 232 terminating above the back side 234. The blind electrical vias 232 have conductive cores 238 with surrounding insulator 236 adjacent side and end regions of the cores. The handler wafer 230 is secured to the front side of the body of main wafer 202. The assembly is shown in FIG. 1.

An additional step includes exposing the blind electrical vias 232 on the back side 234. The blind electrical vias are exposed to various heights (by way of example and not limitation, from about 3 microns to about 8 microns) across the back side, as seen in FIG. 3. Another step involves applying a first chemical mechanical polish process to the back side 234, to open any of the surrounding insulator adjacent the end regions of the cores remaining after the exposing step, and to co-planarize the via conductive cores, the surrounding insulator adjacent the side regions of the cores, and the body of the main wafer, as seen in FIG. 4.

Figure 7:
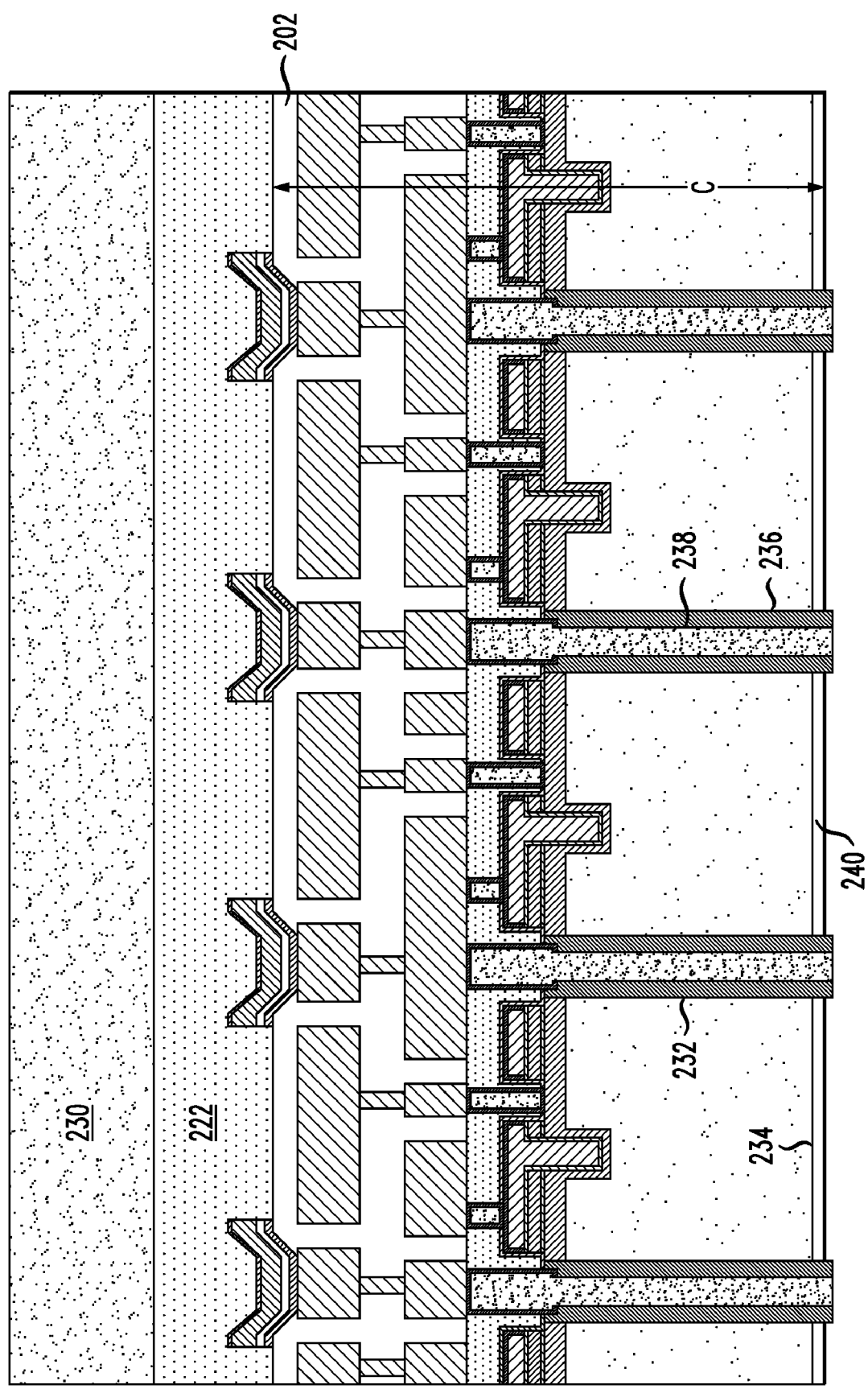

Further steps include etching the back side to produce a uniform standoff height of each of the vias across the back side, as seen in FIG. 5; depositing a dielectric 240 across the back side, as seen in FIG. 6 (for example, by via plasma enhanced chemical vapor deposition); and applying a second chemical mechanical polish process to the back side, to open the dielectric only adjacent the conductive cores of the vias, as seen in FIG. 7.

The aforementioned obtaining step can include, for example, obtaining the main wafer 202, which can be, for example, a silicon wafer; obtaining the handler wafer 230, which can be, for example, glass; and bonding the main wafer 202 to the handler wafer 230; for example, as described with regard to FIGS. 1 and 2. Preferably, the handler wafer 230 has a total thickness variation of less than about 5 microns.

The aforementioned bonding step can include, for example, coating the front side with adhesive 222, aligning the main wafer 202 and the handler wafer 230 with spacers between the handler wafer and the front side; and exposing the aligned main wafer and handler wafer to a vacuum of about $1 \times 10^{-03}$ mbar at an ambient temperature of about 150° C. Further, the aforementioned bonding step can also include increasing the ambient temperature to about 230° C. at about 10° C. per minute; removing the spacers; increasing the ambient temperature to about 350° C. at about 10° C. per minute; applying an ambient pressure of about 1 MPa at the 350° C. ambient temperature for about 15 minutes; and cooling the main wafer and the handler wafer for about 25 minutes to a temperature of about 150° C.

The step of exposing the blind electrical vias 232 can include, for example, thinning the wafer by removing material from the back side until the blind vias are almost exposed, as seen in FIG. 2, and etching the back side to expose the vias to the various heights, as seen in FIG. 3. The thinning step can include conducting a coarse grinding operation in the back side to no closer than 30 microns from a desired depth; conducting a fine grinding operation to the desired depth; and conducting a polishing operation. The etching can include, for example, deep reactive ion etching; for example, at about 4 microns per minute; the etching can instead include, for example, silicon reactive ion etching; for example, at about 1 micron per minute.

An additional step includes forming a plurality of conductive pad structures 250 over the conductive cores 238 of the plurality of vias, on the back side, as seen in FIG. 8.

In one or more embodiments, the depositing of the dielectric produces caps 295 over the vias, as best seen in FIG. 6, and the second chemical mechanical polish process removes the caps.

The methods described above can be used in the fabrication and packaging of integrated circuit chips; in particular, techniques set forth herein can be used to expose TSVs. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising the steps of:
   obtaining an assembly comprising:
      a main wafer having a body with a front side and a back side, said main wafer in turn comprising a plurality of blind electrical vias terminating above said back side, said blind electrical vias having conductive cores with surrounding insulator adjacent side and end regions of said cores; and
      a handler wafer, said handler wafer being secured to said front side;
   exposing said blind electrical vias, on said back side, wherein exposed portions of said blind electrical vias are of various heights across said back side after exposure; wherein said step of exposing said blind electrical vias comprises:
   thinning said wafer by removing material from said back side until said blind vias are almost exposed; and
   dry etching said back side to expose said vias to said various heights;
   applying a chemical mechanical polish process to said back side after said exposing step, to open any of said surrounding insulator adjacent said end regions of said cores remaining after said exposing step, and to coplanarize said via conductive cores, said surrounding insulator adjacent said side regions of said cores, and said body of said main wafer;
   etching said back side to produce a uniform standoff height of each of said vias across said back side; after said application of chemical mechanical polishing process
   depositing a dielectric across said back side; and
   applying a second chemical mechanical polish process to said back side, to open said dielectric only adjacent said conductive cores of said vias.

2. The method of claim 1, wherein said step of obtaining said assembly comprises:
   obtaining said main wafer, said main wafer comprising silicon;
   obtaining said handler wafer, said handler wafer comprising glass; and
   bonding said main wafer to said handler wafer.

3. The method of claim 2, wherein said handler wafer has a total thickness variation of less than about 5 microns.

4. The method of claim 2, wherein said thinning step is carried out to a desired depth and wherein said thinning step comprises:
   conducting a coarse grinding operation in said back side to no closer than 30 microns from said desired depth;
   conducting a fine grinding operation to said desired depth; and
   conducting a polishing operation.

5. The method of claim 2, wherein said etching said back side to expose said vias to said various heights comprises deep reactive ion etching.

6. The method of claim 5, wherein said deep reactive ion etching is carried out at about 4 microns per minute.

7. The method of claim 2, wherein said etching said back side to expose said vias to said various heights comprises silicon reactive ion etching.

8. The method of claim 7, wherein said silicon reactive ion etching is carried out at about 1 micron per minute.

9. The method of claim 2, wherein said various heights range from about 3 microns to about 8 microns.

10. The method of claim 2, wherein said depositing of said dielectric is carried out via plasma enhanced chemical vapor deposition.

11. The method of claim 2, wherein said depositing of said dielectric produces caps over said vias, and wherein said second chemical mechanical polish process removes said caps.

12. The method of claim 2, further comprising the additional step of forming a plurality of conductive pad structures over said conductive cores of said plurality of vias, on said back side.

13. The method of claim 12, wherein said conductive pad structures comprises under-bump metallization pads.

14. The method of claim 13, further comprising forming controlled collapse chip connection solder bumps on said under-bump metallization pads.

15. The method of claim 2, wherein said vias are slot-shaped in cross section.

16. The method of claim 2, wherein said vias are bar-shaped in cross section.

17. The method of claim 2, wherein said vias are annular in cross section.

18. The method of claim 2, wherein said vias are C-shaped in cross section.

* * * * *